(12) United States Patent
Ying (10) Patent No.: US 11,576,240 B2
(45) Date of Patent: Feb. 7, 2023

(54) NOISE REDUCTION CIRCUIT FOR MATRIX LED DRIVER

(71) Applicant: SI EN TECHNOLOGY (XIAMEN) LIMITED, Fujian (CN)

(72) Inventor: Kewei Ying, Xiamen (CN)

(73) Assignee: SI EN TECHNOLOGY (XIAMEN) LIMITED, Fujian (CN)

( * ) Notice: Subject to any disclaimer, the term of this patent is extended or adjusted under 35 U.S.C. 154(b) by 0 days.

(21) Appl. No.: 17/502,047

(22) Filed: Oct. 15, 2021

(65) Prior Publication Data

US 2023/0007749 A1 Jan. 5, 2023

(30) Foreign Application Priority Data

Jul. 1, 2021 (CN) .......................... 202110742940.8

(51) Int. Cl.
*H05B 45/30* (2020.01)
*H05B 45/44* (2020.01)
*H05B 45/325* (2020.01)
*H05B 45/36* (2020.01)
*H03K 3/84* (2006.01)

(52) U.S. Cl.
CPC ............ *H05B 45/44* (2020.01); *H03K 3/84* (2013.01); *H05B 45/325* (2020.01); *H05B 45/36* (2020.01)

(58) Field of Classification Search
CPC .... H05B 45/38; H05B 45/375; H05B 45/395; H05B 45/3725; G09G 3/3216; G09G 3/3283; G09G 3/3611; G09G 3/3688
See application file for complete search history.

(56) References Cited

U.S. PATENT DOCUMENTS

| | | | |
|---|---|---|---|
| 6,144,364 A * | 11/2000 | Otobe .................. | G09G 3/2051 345/63 |
| 11,282,434 B1 * | 3/2022 | Chan .................... | G09G 3/204 |
| 2013/0020197 A1 * | 1/2013 | Winkler .............. | G01N 27/305 204/406 |
| 2013/0250215 A1 * | 9/2013 | Sasaki .................. | H05B 45/327 349/69 |
| 2016/0163255 A1 * | 6/2016 | Kim ..................... | G09G 3/3233 345/212 |
| 2016/0219663 A1 * | 7/2016 | Chen .................. | H05B 45/3725 |
| 2017/0076666 A1 * | 3/2017 | Kawana ............... | G09G 3/3266 |

* cited by examiner

*Primary Examiner* — Tung X Le (74) *Attorney, Agent, or Firm* — Leong C. Lei (57) ABSTRACT

A noise reduction circuit for a matrix LED driver includes a pseudo random number generator, an up counter, a clock module, and a plurality of matrix switch controllers. The matrix switch controllers and the up counter randomly change a power-on sequence applied across matrix switches in the matrix LED driver according to working random numbers generated by the pseudo random number generator. The circuit prevents jitter-induced noise from periodically reoccurring at the power source of the matrix LED driver, thereby reducing noise energy.

10 Claims, 6 Drawing Sheets

NOISE REDUCTION CIRCUIT FOR MATRIX LED DRIVER

BACKGROUND OF THE INVENTION

1. Field of the Invention

The present invention relates to LED drive circuits, and more particularly to a noise reduction circuit for a matrix LED driver.

2. Description of the Prior Art

Recently, light-emitting diodes (LEDs) have been extensively used for various applications like LED lamps due to its advantages in terms of, for example, power efficiency, sustainability, impact resistance, anti-lightning ability, and service life. One noticeable issue to be address coining along with the popularity of LED-based devices is how to drive LEDs effectively and efficiently. As known, LED drivers are typically used to drive LED-based devices like LED lamps.

Figure 1:
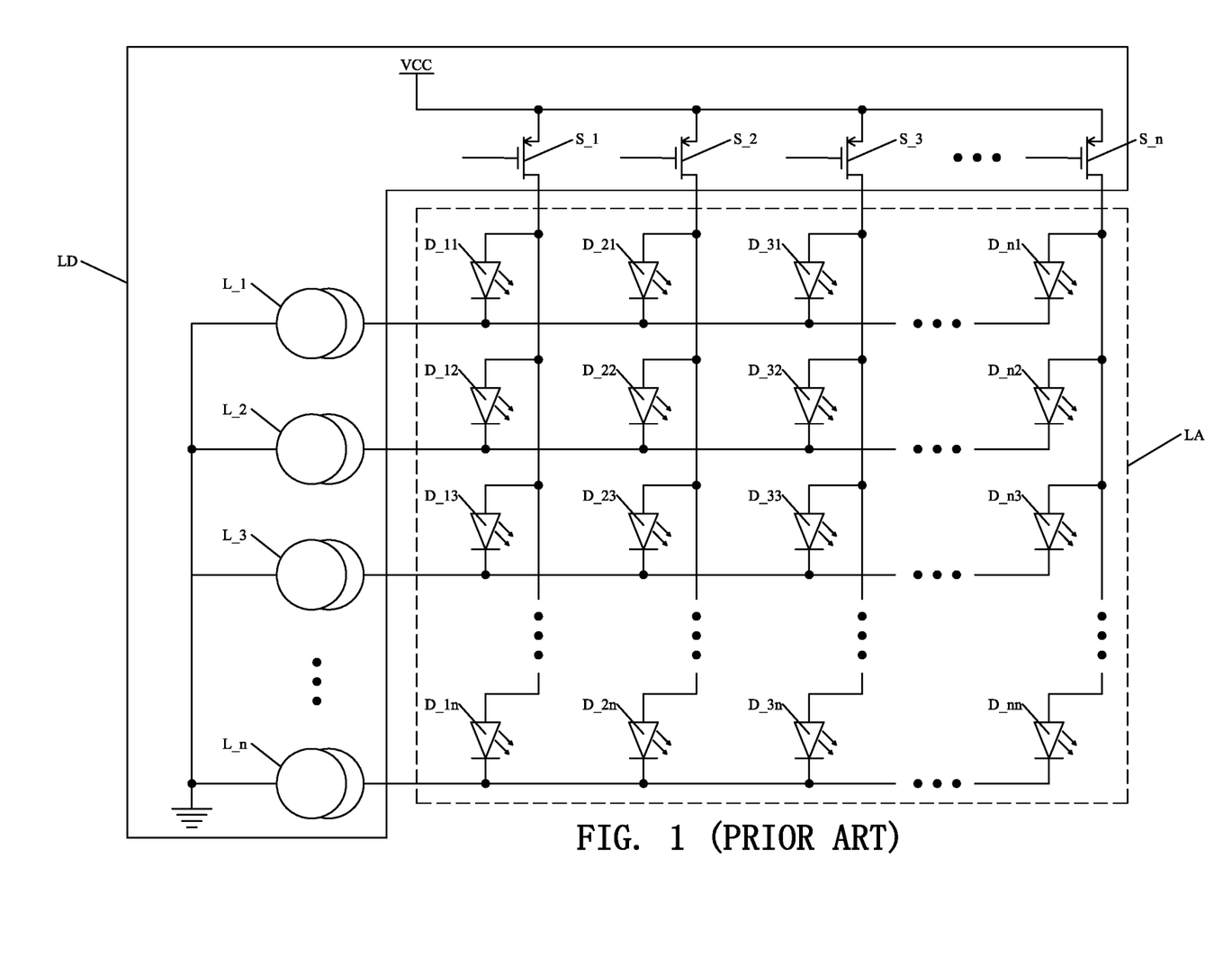
FIG. 1 is an applied diagram of a conventional matrix LED driver.

In order to relax the requirements for leads of LED drivers in LED lamps, a matrix LED driver LD as shown in FIG. 1 has been developed for driving an LED array LA. The matrix LED driver LD has a plurality of matrix switches S and a plurality of current channels L. Each of the matrix switches S of the matrix LED driver LD controls whether LED lamps D in a row of the LED array LA are on or off. Each of the current channels L in the matrix LED driver LD is connected to a respective row of LED lamps D in the LED array LA. Therein, the matrix switches S of the matrix LED driver LD are turned on sequentially during one cycle of its scan clock. When the cycle length of the scan clock is short enough, the LED lamps D of the matrix LED array LA look like being turned on simultaneously to human eyes. For controlling the illumination of the LED lamps D, each of the current channels L generates a PWM current signal for the corresponding LED lamp D to accordingly modulate its own illumination. The PWM current signal has a frequency higher than the frequency of the scan clock. Since the PWM current signals of different current channels L may be different in terms of duty ratio, the total working circuit of the matrix LED array LA can vary during the period when each of the matrix switches S is on, so that the total current of the matrix LED array LA shows abrupt change during every cycle of the scan clock. In addition, as the matrix switches S of the matrix LED driver LD are turned on periodically, such abruptness is periodically seen in the total current of the matrix LED array. The periodic, abrupt change of the total current of the matrix LED array LA in turn leads to periodic jitter in the voltage of the power supply to the matrix LED driver LD, resulting in supply jitter-induced noise reoccurring at a fixed frequency. Generally, the frequency of the supply jitter-induced noise is lower than the frequency of the PWM current signal, and the supply jitter-induced noise can cause electromagnetic interference and even noise hearable to human ears, which is averse to comfort of users of the matrix LED driver LD.

SUMMARY OF THE INVENTION

One objective of the present invention is to provide a noise reduction circuit for a matrix LED driver, which prevents supply jitter-induced noise from occurring periodically, thereby reducing energy of supply jitter-induced noise.

In order to achieve the foregoing objective, the present invention provides the following solution:

A noise reduction circuit for a matrix LED driver comprises a pseudo random number generator, an up counter, a clock module, and N matrix switch controllers, where N is a decimal integer greater than or equal to two. The clock module is configured to provide the pseudo random number generator with a scan clock and provide the up counter with a count clock, wherein the scan clock has a cycle length that is N times as great as a cycle length of the count clock. The pseudo random number generator is configured to generate a working random number for the up counter during every cycle of the scan clock, wherein the working random number is a binary integer and has a decimal numerical value set to be ranging [0, N−1]. The up counter is configured to, between a start time and a storage time of a said cycle of the scan clock, receive the working random number and output the working random number as a random power-on number, wherein a time length between the start time and the storage time of a said cycle of the scan clock is smaller than the cycle length of the count clock. The up counter adds one to the random power-on number and outputs a resulting value every time the cycle length of the count clock elapses. In a said cycle of the scan clock, where a decimal numerical value of the random power-on number is equal to N, the up counter calibrates the random power-on number to zero and outputs the calibrated random power-on number, wherein the random power-on number is a binary integer and has the decimal numerical value set to be ranging [0, N−1]. The matrix switch controllers each are a numerical comparator and have a first input port being input with a criterion numeral different from criterion numerals input to the other matrix switch controllers. The criterion numerals each are a binary integer and have a decimal numerical value set to be ranging [0, N−1]. The matrix switch controllers each have a second input port configured to receive a random power-on number output by the up counter, so that when the random power-on number received by a matrix switch controller at its second input port is identical to the criterion numeral input to its first input port, that matrix switch controller outputs a matrix switch power-on signal at its output end.

The pseudo random number generator includes a pseudo random number generating unit. The pseudo random number generating unit includes an Exclusive-OR gate and M D flip-flops, where M is a decimal integer, and M satisfies: $2^M \geq N$. A CLK end of every D flip-flop receives the scan clock provided by the clock module, a Q end of the $i^{th}$ D flip-flop is connected to a D end of the $(i+1)^{th}$ D flip-flop, where i is a decimal integer, and i has a decimal numerical value of [1, M−1]. A first input end of the Exclusive-OR gate is connected to the Q end of the first D flip-flop, a second input end of the Exclusive-OR gate is connected to the Q end of the $M^{th}$ D flip-flop, and an output end of the Exclusive-OR gate is connected to the D end of the first D flip-flop. A Q' end of the first D flip-flop of the pseudo random number generating unit through a Q' end of the $P^{th}$ D flip-flop are configured to output the value of each order digit of the working random number from the low-order digit to the high-order digit successively, where P is a decimal integer, and P satisfies: $2^P = N$.

The up counter includes R up-count units, where R is a decimal integer, and R satisfies: $2^R = N$. The up-count unit includes a latch D flip-flop, a first AND gate, a second AND gate, and a NOT gate. A first input end of the first AND gate is connected to an input end of the NOT gate and acts as an input end of the up-count unit. An output end of the NOT gate is connected to a first input end of the second AND gate. A second input end of the first AND gate and a second input end of the second AND gate receive a same latch signal. An output end of the first AND gate is connected to a CLR end of the latch D flip-flop. An output end of the second AND gate is connected to a SET end of the latch D flip-flop. A D end and a Q' end of the latch D flip-flop are connected to each other and jointly act as an output end of the up-count unit. A CLK end of the latch D flip-flop of the first up-count unit of the up counter receives the count clock provided by the clock module. A Q end of the latch D flip-flop of the $j^{th}$ up-count unit is connected to the CLK end of the latch D flip-flop of the $(j+1)^{th}$ up-count unit, where j is a decimal integer, and j has a decimal numerical value of [1, R−1]. The input end of the first up-count unit of the up counter through the input end of the $R^{th}$ up-count unit are configured to receive the value of each order digit of the working random number from the low-order digit to the high-order digit successively. The output end of the first up-count unit of the up counter through the output end of the $R^{th}$ up-count unit are configured to output the value of each order digit of the random power-on number from the low-order digit to the high-order digit successively.

The pseudo random number generator includes a pseudo random number generating unit and a pseudo random number correcting unit. The pseudo random number generating unit is configured to generate an initial random number for every cycle of the scan clock. The initial random number is a binary integer, and the initial random number has a decimal numerical value set to be ranging [0, $2^S$−1], where S is a decimal integer, and S satisfies: $2^{S-1}$≤N≤$2^S$. The pseudo random number correcting unit is configured to control the pseudo random number generator to generate the working random number according to the initial random number. When the initial random number is smaller than N, the pseudo random number correcting unit controls the pseudo random number generator to generate the working random number equal to the initial random number. When the initial random number is greater than or equal to N, the pseudo random number correcting unit controls the pseudo random number generator to generate the working random number equal to the initial random number minus an offset value, wherein the offset value is $2^{S-1}$.

The pseudo random number generating unit includes an Exclusive-OR gate and M D flip-flops, where M is a decimal integer, and M satisfies: M≥S. A CLK end of every D flip-flop of the pseudo random number generating unit receives the scan clock provided by the clock module. A Q end of the $i^{th}$ D flip-flop is connected to a D end of the $(i+1)^{th}$ D flip-flop, where i is a decimal integer, and i has a decimal numerical value of [1, M−1]. A first input end of the Exclusive-OR gate is connected to the Q end of the first D flip-flop. A second input end of the Exclusive-OR gate is connected to the Q end of the $M^{th}$ D flip-flop. An output end of the Exclusive-OR gate is connected to the D end of the first D flip-flop. A Q' end of the first D flip-flop of the pseudo random number generating unit through a Q' end of the $S^{th}$ D flip-flop are configured to output the value of each order digit of the initial random number from the low-order digit to the high-order digit successively.

The pseudo random number correcting unit includes T random number comparators, an OR-NOT gate, and an AND gate; where T is a decimal integer, and T satisfies: T=$2^S$−N. Each random number comparator is a numerical comparator. Different offset numbers are input to the random number comparators at their first input port, where the offset numbers are binary integers, and the decimal numerical values of the offset numbers input to the first input ports of the random number comparators are each set to be ranging [N, $2^S$−1]. A second input port of every random number comparator receives the initial random number output by the pseudo random number generating unit. When the initial random number the random number comparator receives at its second input port is identical to the offset number input to its first input port, the output end of the random number comparator outputs a high-level signal. Input ends of the OR-NOT gate are connected to the respective output ends of the random number comparators. An output end of the OR-NOT gate is connected to a first input end of the AND gate. A second input end of the AND gate is connected to the Q' end of the $S^{th}$ D flip-flop of the pseudo random number generating unit. The Q' end of the first D flip-flop of the pseudo random number generating unit through the Q' end of the $(S−1)^{th}$ D flip-flop and an output end of the AND gate of the pseudo random number correcting unit are configured to output the value of each order digit of the working random number from the low-order digit to the high-order digit successively.

The up counter includes W up-count units and a calibrating unit, where W is a decimal integer, and W satisfies: $2^{W-1}$≤N≤$2^W$. The up-count unit includes a latch D flip-flop, a first AND gate, a second AND gate, a NOT gate, and an OR gate. A first input end of the first AND gate is connected to an input end of the NOT gate and acts as an input end of the up-count unit. An output end of the NOT gate is connected to a first input end of the second AND gate. A second input end of the first AND gate and a second input end of the second AND gate are connected to a same latch signal lock. An output end of the first AND gate is connected to a CLR end of the latch D flip-flop. An output end of the second AND gate is connected to a first input end of the OR gate. An output end of the OR gate is connected to a SET end of the latch D flip-flop. A D end and a Q' end of the latch D flip-flop are connected to each other and jointly act as an output end of the up-count unit. A CLK end of the latch D flip-flop of the first up-count unit of the up counter receives the count clock provided by the clock module. A Q end of the latch D flip-flop of the $k^{th}$ up-count unit is connected to the CLK end of the latch D flip-flop of the $(k+1)^{th}$ up-count unit, where k is a decimal integer, and k has a decimal numerical value of [1, W−1]. The input end of the first up-count unit of the up counter through the input end of the $W^{th}$ up-count unit are configured to receive the value of each order digit of the working random number from the low-order digit to the high-order digit successively. The output end of the first up-count unit of the up counter through the output end of the $W^{th}$ up-count unit are configured to output the value of each order digit of the random power-on number from the low-order digit to the high-order digit successively. The calibrating unit includes a calibrating comparator. The calibrating comparator is a numerical comparator. A calibrating number is input to the calibrating comparator at its first input port, where the calibrating number is a binary integer, the calibrating number has a decimal numerical value of N. A second input port of the calibrating comparator receives the random power-on number. When the random power-on number the calibrating comparator receives at its second input port is identical to the calibrating number input to its first input port, an output end of the calibrating comparator outputs a high-level signal.

By employing the aforementioned scheme, in the present invention. The pseudo random number generator generates a working random number for the up counter during every cycle of the scan clock. The up counter receives the working random number between the start time and the storage time of a cycle of the scan clock and outputs the working random number as a random power-on number. Therein, the length between the start time and the storage time of a said cycle of the scan clock is smaller than the cycle length of the count clock. The up counter adds one to the random power-on number and outputs a resulting value every time the cycle length of the count clock elapses. In a cycle of the scan clock, where the decimal numerical value of the random power-on number is equal to N, the up counter calibrating the random power-on number to zero and outputting the calibrated random power-on number. In this way, across different cycles of the scan clock, the up counter outputs the random power-on numbers in a randomly changing sequence. Since every matrix switch controller only outputs the matrix switch power-on signal when the random power-on number it receives at its second input port is identical to the criterion numeral input to its first input port, the present invention allows the matrix switch controllers to output matrix switch power-on signals in a randomly changing sequence throughout cycles of the scan clock.

In use of the present invention, the individual matrix switch controllers are configured to control whether the individual matrix switches of the matrix LED driver are on, respectively. When one of the matrix switch controllers outputs a matrix switch signal, the matrix switch controlled by that matrix switch controller is turned on. Since the matrix switch controller its matrix switch power-on signals at random ranking places in the randomly changing sequence for different cycles of the scan clock, the present invention allows the matrix switches to have a randomly changing power-on sequence throughout different cycles of the scan clock, thereby making the total current of the matrix LED array controlled by the matrix LED driver not have periodic abruptness, and in turn making the supply jitter-induced noise generated by the matrix LED driver not periodic. As compared to periodic supply jitter-induced noise reoccurring at a fixed frequency, non-periodic supply jitter-induced noise distributes energy across different sub-frequencies, thereby effectively reducing noise energy.

DETAILED DESCRIPTION OF THE PREFERRED EMBODIMENTS

For further explaining the technical schemes of the present invention, the following description is made with reference to some specific embodiments.

As shown in FIG. 2 through FIG. 6, the present invention discloses a noise reduction circuit for a matrix LED driver. The circuit comprises a pseudo random number generator 1, an up counter 2, a clock module 3, and N matrix switch controllers 4, where N is a decimal integer greater than or equal to 2. The clock module 3 is configured to provide the pseudo random number generator 1 with a scan clock CLK.

Figure 2:
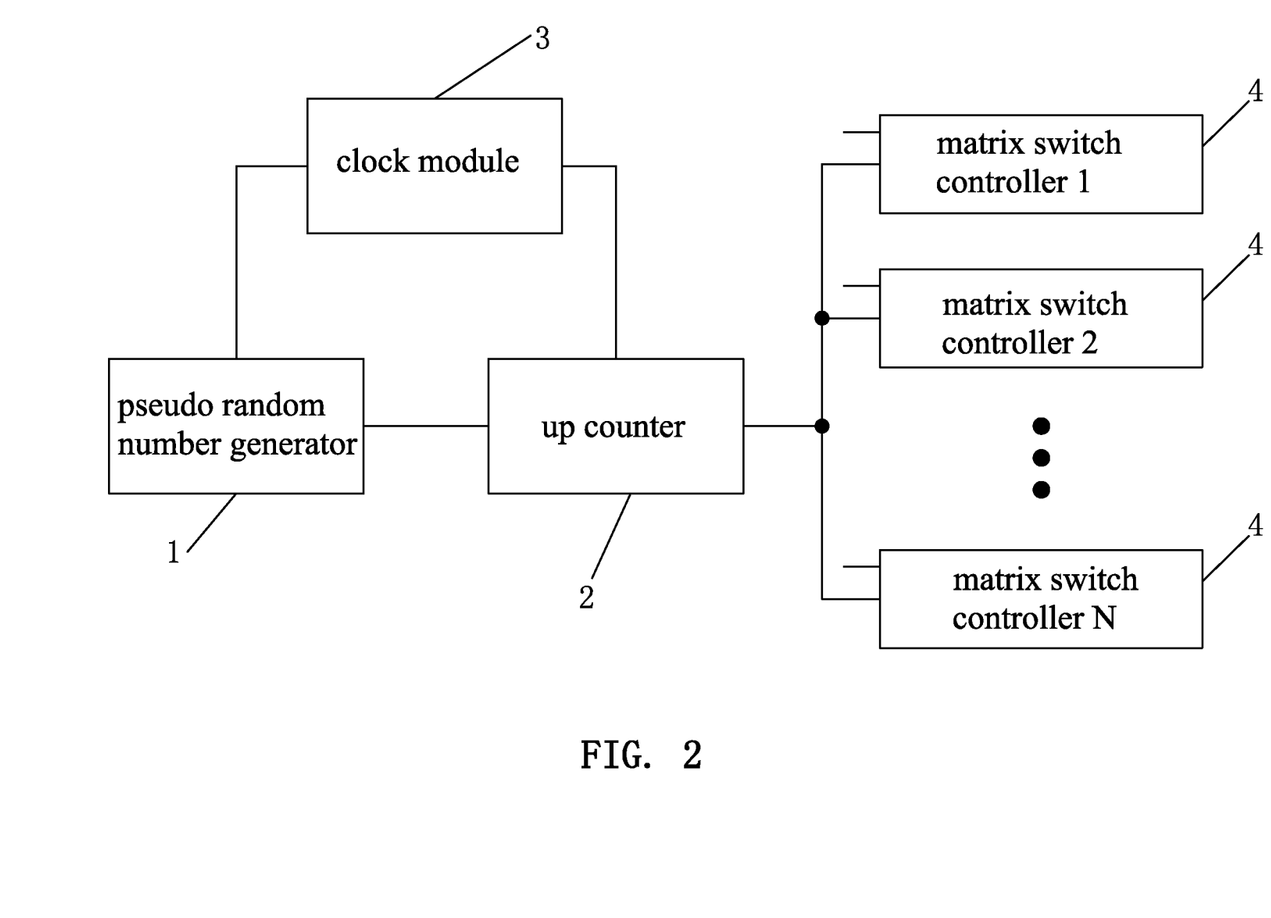
FIG. 2 is a circuit diagram of the circuit of the present invention.

The clock module 3 is further configured to provide the up counter 2 with a count clock PWM_CLK. The scan clock CLK has a cycle length that is N times as great as the cycle length of the count clock PWM_CLK.

In the present invention, the pseudo random number generator 1 is configured to generate a working random number to the up counter 2 during every cycle of the scan clock. The pseudo random number is a binary integer, and the pseudo random number has its decimal numerical value set to be ranging [0, N−1].

In the present invention, the up counter 2, between the start time and the storage time of a cycle of the scan clock, uses the working random number it receives as a random power-on number for outputting. The time length from the start time to the storage time of a cycle of the scan clock is smaller than the cycle length of the count clock. Further, the up counter 2 adds one to the random power-on number and outputs the result every time the cycle length of the count clock elapses. Moreover, in a cycle of the scan clock, if the decimal numerical value of the random power-on number is equal to N, the up counter 2 calibrates the random power-on number to zero and then output it. Therein, the random power-on number is a binary integer, and the decimal numerical value of the random power-on number is set to be ranging [0, N−1]. When the up counter 2 sums the count and the pseudo random number it receives to obtain the random power-on number, it does not perform carrying, meaning that the up counter 2 works as a half adder.

In the present invention, the matrix switch controllers 4 are each a numerical comparator. The matrix switch controller 4 has its first input port input with a criterion numeral different from criterion numerals input to the other matrix switch controllers, and the decimal numerical value of the criterion numeral input to the first input port of the matrix switch controller 4 is set to be ranging [0, N−1]. In other words, the criterion numerals input to the first input ports of the individual matrix switch controllers 4 are 0 through N−1, respectively. Every matrix switch controller 4 receives at its second input port the random power-on number output by the up counter 2. If the random power-on number the matrix switch controller 4 receives at its second input port receive is identical to the criterion numeral input to its first input port, the matrix switch controller 4 outputs a matrix switch power-on signal at its output end. The matrix switch power-on signal is configured to turn on the matrix switch. The matrix switch power-on signal may be a high-level signal.

For easy understanding of the present invention, the working principle of the present invention is expounded as below.

According to the present invention, the up counter 2, between a start time and a storage time of a said cycle of the scan clock, uses the working random number it receives as a random power-on number for outputting. The time length from the start time to the storage time of a cycle of the scan clock is smaller than the cycle length of the count clock. Further, the up counter 2 adds one to the random power-on number and outputs the result every time the cycle length of the count clock elapses. Moreover, in a cycle of the scan clock, if the decimal numerical value of the random power-on number is equal to N, the up counter 2 calibrates the random power-on number to zero and then output it. Since the cycle length of the scan clock is N times as great as the cycle length of the count clock, the up counter 2 successively outputs N different random power-on numbers to the matrix switch controllers 4 during a cycle of the scan clock, and the random power-on number has a decimal numerical value of [0, N−1]. Further because the pseudo random number generator 1 generates a working random number for the up counter 2 in a cycle of the scan clock, the up counter 2 outputs the random power-on numbers in a sequence that changes randomly in different cycles of the scan clock. Taking a case where N=4 for instance, if the working random number the pseudo random number generator 1 outputs to the up counter 2 has a decimal numerical value of 2, the random power-on number output by the up counter 2 in a cycle of the scan clock have their decimal numerical values as 2, 3, 0, and 1 successively. In another instance where N=4, if the working random number the pseudo random number generator 1 outputs to the up counter 2 has a decimal numerical value of 3, the random power-on number output by the up counter 2 in a cycle of the scan clock have their decimal numerical values as 3, 0, 1, and 2 successively. When N=7, if the working random number the pseudo random number generator 1 outputs to the up counter 2 has a decimal numerical value of 5, the random power-on number output by the up counter 2 in a cycle of the scan clock have their decimal numerical values as 5, 6, 0, 1, 2, 3, and 4 successively.

In the present invention, when the random power-on number a matrix switch controller 4 receives at its second input port is identical to the criterion numeral input to its first input port, the matrix switch controller 4 outputs a matrix switch power-on signal. In this way, where the up counter 2 outputs N different random power-on numbers successively to the matrix switch controller 4 in a cycle of the scan clock, the matrix switch controller 4 outputs matrix switch power-on signals sequentially in a cycle of the scan clock, and throughout cycles of the scan clock, the up counter 2 outputs random power-on numbers in a sequence that randomly changes. This makes every matrix switch controller 4 output its matrix switch power-on signals at random ranking places in the randomly changing sequence for different cycles of the scan clock.

In use of the present invention, the individual matrix switch controllers 4 are configured to control whether the individual matrix switches of the matrix LED driver are on, respectively. When one of the matrix switch controllers 4 outputs a matrix switch signal, the matrix switch controlled by that matrix switch controller 4 is turned on. Since the matrix switch controller 4 its matrix switch power-on signals at random ranking places in the randomly changing sequence for different cycles of the scan clock, the present invention allows the matrix switches to have a randomly changing power-on sequence throughout different cycles of the scan clock, thereby making the total current of the matrix LED array controlled by the matrix LED driver not have periodic abruptness, and in turn making the supply jitter-induced noise generated by the matrix LED driver not periodic. As compared to periodic supply jitter-induced noise reoccurring at a fixed frequency, non-periodic supply jitter-induced noise distributes energy across different sub-frequencies, thereby effectively reducing noise energy.

For easy understanding of the present invention, two embodiments will be detailed below to explain the pseudo random number generator 1 and the up counter 2 of the present invention.

Embodiment 1

In the first embodiment of the present invention, the pseudo random number generator 1 and the up counter 2 are configured to be applicable to the case where N is a powerful number of two.

Figure 3:
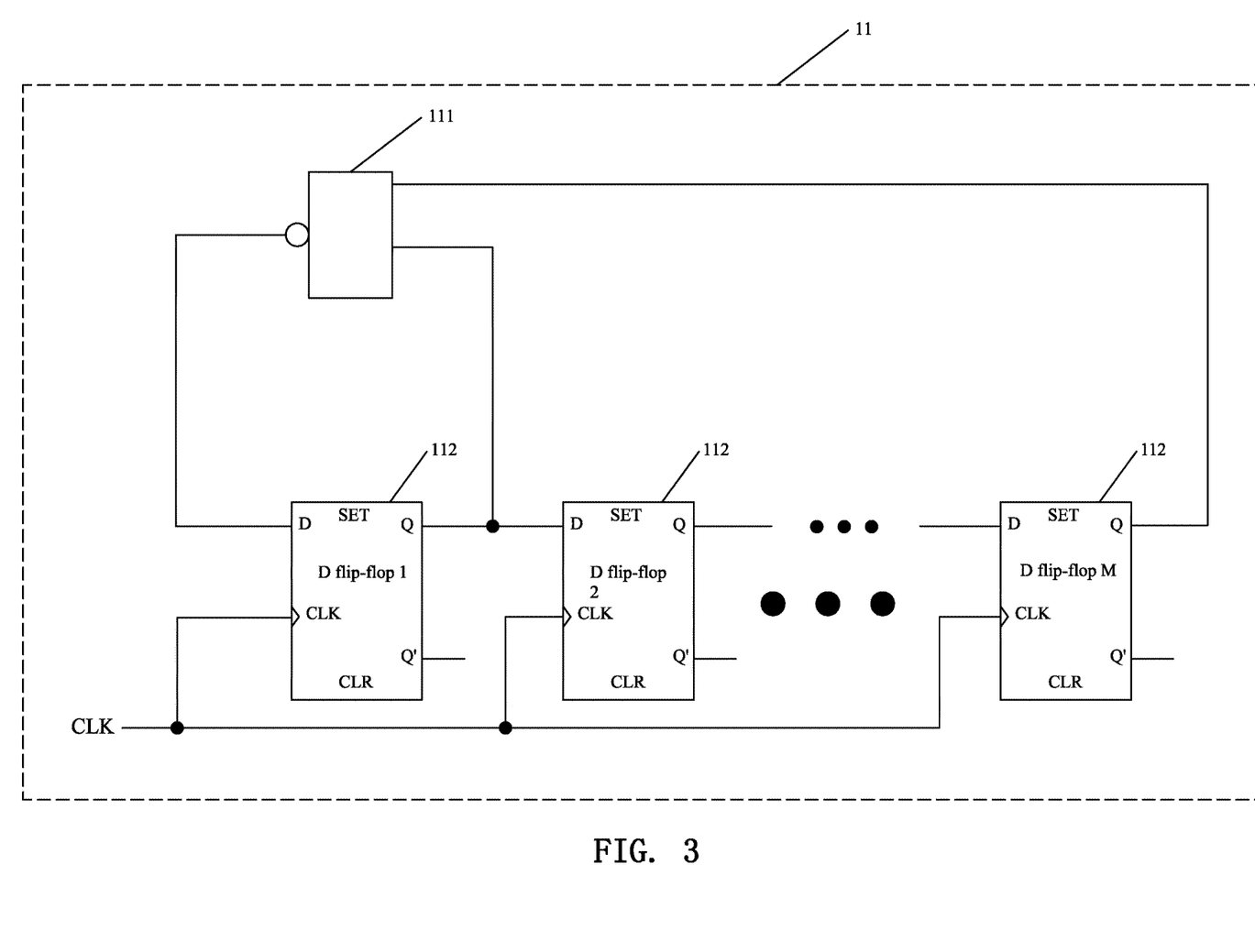
FIG. 3 is a circuit diagram of a pseudo random number generator in a first embodiment of the present invention.

Referring to FIG. 3, in the first embodiment of the present invention, the pseudo random number generator 1 includes a pseudo random number generating unit 11. The pseudo random number generating unit 11 includes an Exclusive-OR gate 111 and M D flip-flops 112, where M is a decimal integer, and M satisfies: $2^M \geq N$. Therein, the CLK end of every D flip-flop 112 receives the scan clock CLK provided by the clock module 3. The Q end of the $i^{th}$ D flip-flop 112 is connected to the D end of the $(i+1)^{th}$ D flip-flop 112, where i is a decimal integer, and i has a decimal numerical value of [1, M−1]. The first input end of the Exclusive-OR gate 111 is connected to the Q end of the first D flip-flop 112. The second input end of the Exclusive-OR gate 111 is connected to the Q end of the $M^{th}$ D flip-flop 112. The output end of the Exclusive-OR gate 111 is connected to the D end of the first D flip-flop 112. The Q' end of the first D flip-flop 112 of the pseudo random number generating unit 11 through the Q' end of the $P^{th}$ D flip-flop 112 are configured to output the value of each order digit of the working random number from the low-order digit to the high-order digit successively, where P is a decimal integer, and P satisfies: $2^P = N$. In the pseudo random number generator 1 of the first embodiment of the present invention, the individual D flip-flops 112 form an M-digit shift register. The shift register shifts every time it undergoes a cycle of the scan clock, thereby making the pseudo random number generator 1 generate a working random number during every cycle of the scan clock. In the pseudo random number generator 1 of the first embodiment of the present invention, the greater value of M is, the better the case is. When the value of M is greater, the cycle length for the pseudo random number generator 1 to generate a repeated pseudo random number is longer. In the present invention, the value of M is such set that the cycle length for the pseudo random number generator 1 to generate a repeated pseudo random number is much greater than the cycle length of the scan clock CLK, so that the working random number can be deemed as a true random number. For example, when N=4, M=12.

Figure 4:
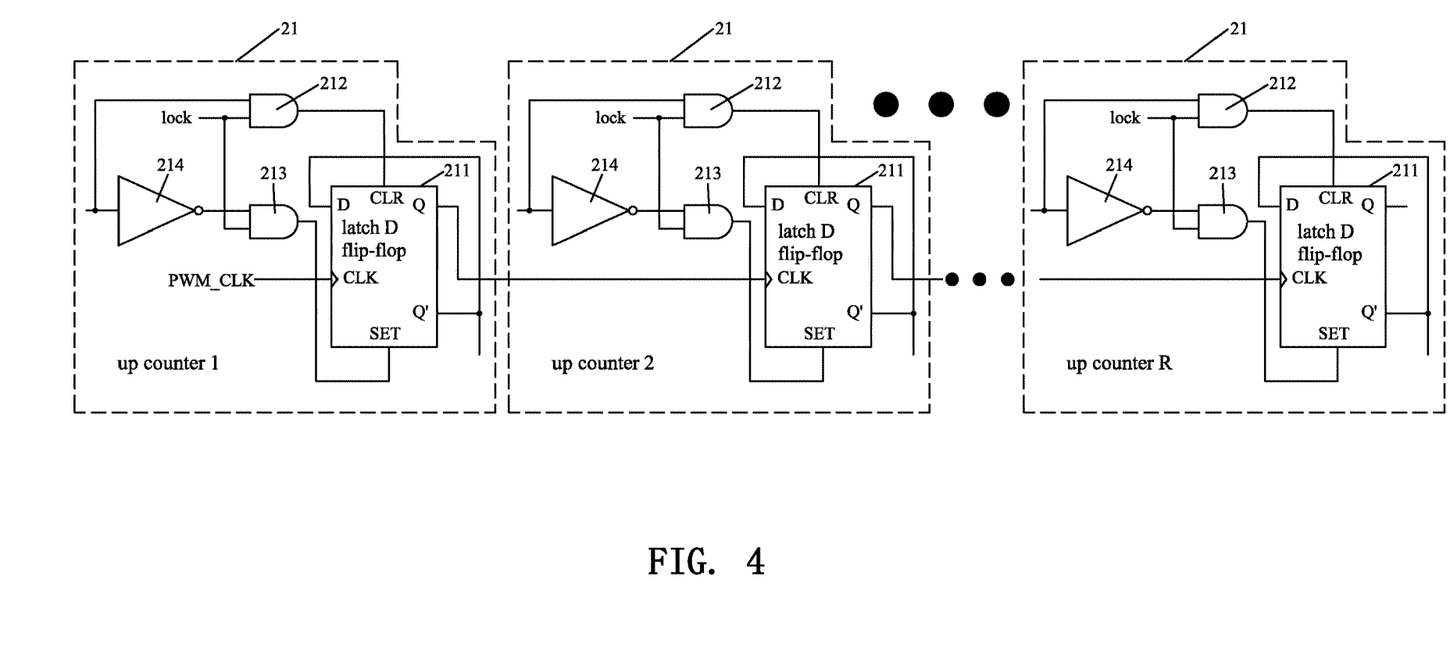
FIG. 4 is a circuit diagram of an up counter in the first embodiment of the present invention.

Referring to FIG. 4, in the first embodiment of the present invention, the up counter 2 includes R up-count units 21, where R is a decimal integer, and R satisfies: $2^R = N$. The up-count unit 21 includes a latch D flip-flop 211, a first AND gate 212, a second AND gate 213, and a NOT gate 214. Therein, the first input end of the first AND gate 212 is connected to the input end of the NOT gate 214 and acts as the input end of the up-count unit 21. The output end of the NOT gate 214 is connected to the first input end of the second AND gate 213. The second input end of the first AND gate 212 and the second input end of the second AND gate 213 receive the same latch signal lock. The output end of the first AND gate 212 is connected to the CLR end of the latch D flip-flop 211. The output end of the second AND gate 213 is connected to the SET end of the latch D flip-flop 211. The D end and the Q' end of the latch D flip-flop 211 are connected to each other and jointly act as the output end of the up-count unit 21. The CLK end of the latch D flip-flop 211 of the first up-count unit 21 of the up counter 2 receives the count clock PWM_CLK provided by the clock module 3. The Q end of the latch D flip-flop 211 of the $j^{th}$ up-count unit 21 is connected to the CLK end of the latch D flip-flop 211 of the $(j+1)^{th}$ up-count unit 21, where j is a decimal integer, and j has a decimal numerical value of [1, R−1]. The input end of the first up-count unit 21 of the up counter 2 through the input end of the $R^{th}$ up-count unit 21 are configured to receive the value of each order digit of the working random number from the low-order digit to the high-order digit successively. The output end of the first up-count unit 21 of the up counter 2 through the output end of the $R^{th}$ up-count unit 21 are configured to output the value of each order digit of the random power-on number from the low-order digit to the high-order digit successively. Therein, the input level at the input end of the up-count unit 21 depends on the value of the corresponding order digit in the working random number received at the input end of the up-count unit 21. When the value of the corresponding order digit in the working random number received at the input end of the up-count unit 21 is 0, the input level at the input end of the up-count unit 21 is low. When the value of the corresponding order digit in the working random number received at the input end of the up-count unit 21 is 1, the input level at the input end of the up-count unit 21 is high. When the output end of the up-count unit 21 outputs a high level, it means that in the random power-on number output by the up counter 2 the value of the order digit corresponding to the up-count unit 21 is 1. When the output end of the up-count unit 21 outputs a low level, it means that in the random power-on number output by the up counter 2 the value of the order digit corresponding to the up-count unit 21 is 0.

The up counter 2 of the first embodiment of the present invention works on the following principle.

The latch signal lock between the start time and the storage time of every cycle of the scan clock is of a high level, whereas the latch signal lock between the storage time and the end time of every cycle of the scan clock is of a low level. The time length between the start time and the storage time of a cycle of the scan clock is smaller than the cycle length of the count clock PWM_CLK.

According to the first embodiment of the present invention, in the time period wherein the latch signal lock of the up-count unit 21 in a cycle of the scan clock is of a high level, the output levels of the first AND gate 212 and the second AND gate 213 of the up-count unit 21 are determined by the input level at the input end of the up-count unit 21. If the input level at the input end of the up-count unit 21 is a high level, the first AND gate 212 and the second AND gate 213 of the up-count unit 21 output a high level and a low level, respectively, so that the levels at the CLR end the SET end of the latch flip-flop 211 of the up-count unit 21 are a high level and a low level, respectively. This makes the latch flip-flop 211 of the up-count unit 21 performs resetting operation, thereby making the Q' end of the latch flip-flop 211 of the up-count unit 21 output a high level. In other words, the output end of the up-count unit 21 outputs a high level. On the other hand, if the input level at the input end of the up-count unit 21 is a low level, the first AND gate 212 and the second AND gate 213 of the up-count unit 21 output a low level and a high level, respectively, so that the levels at the CLR end and the SET end of the latch flip-flop 211 of the up-count unit 21 are low and high, respectively. This makes the latch flip-flop 211 of the up-count unit 21 performs setting operation, thereby making the Q' end of the latch flip-flop 211 of the up-count unit 21 output a low level. In other words, the output end of the up-count unit 21 outputs a low level. As can be seen from the previous description, in the time period where the latch signal lock of the up-count unit 21 is of a high level, the up-count unit 21 latches the input level at its input end to its output end. In this way, the up counter 2 in the time period where the latch signal lock is of a high level latches the value of each order digit of the working random number it receives to the latch flip-flops 211 of the individual up-count units 21 of the up counter 2, respectively. To state differently, the up counter 2 in the time period where the latch signal lock is of a high level uses the working random number it receives as the random power-on number for latching and outputting, so that the random power-on number output by the up counter 2 in a time period where the latch signal lock is of a high level is equal to the working random number the up counter 2 receives, thereby realizing the process that the up counter uses the working random number it receives as a random power-on number for outputting between a start time and a storage time of a said cycle of the scan clock.

According to the first embodiment of the present invention, during a cycle of the scan clock, in a time period where the latch signal lock of the up-count unit 21 is of a low level, the levels at both the first AND gate 212 and the second AND gate 213 of the up-count unit 21 are low, so that the levels at both the CLR end and the SET end of the latch flip-flop 211 of the up-count unit 21 are low, making the up-count unit 21 have the latch flip-flop 211 of triggered when its CLK end generates a rising edge. Since the CLK end of the latch D flip-flop 211 of the first up-count unit 21 of the up counter 2 receives the count clock PWM_CLK provided by the clock module 3, the Q end of the latch D flip-flop 211 of the $j^{th}$ up-count unit 21 is connected to the CLK end of the latch D flip-flop 211 of the $(j+1)^{th}$ up-count unit 21. Thus, in a cycle of the scan clock, the up counter 2 performs add-one operation once every time the cycle length of the count clock elapses, thereby adding 1 to the random power-on number and outputting the result. Therein, when the decimal numerical value of the random power-on number is equal to N, N is a powerful number of two. In this case, the up-count unit 21 does not perforin carrying, and thereby the random power-on number now is calibrated to zero.

Second Embodiment

In the second embodiment of the present invention, the pseudo random number generator 1 and the up counter 2 are such configured that they are applicable to both the case where N is not a powerful number of two and the case where N is a powerful number of two.

Figure 5:
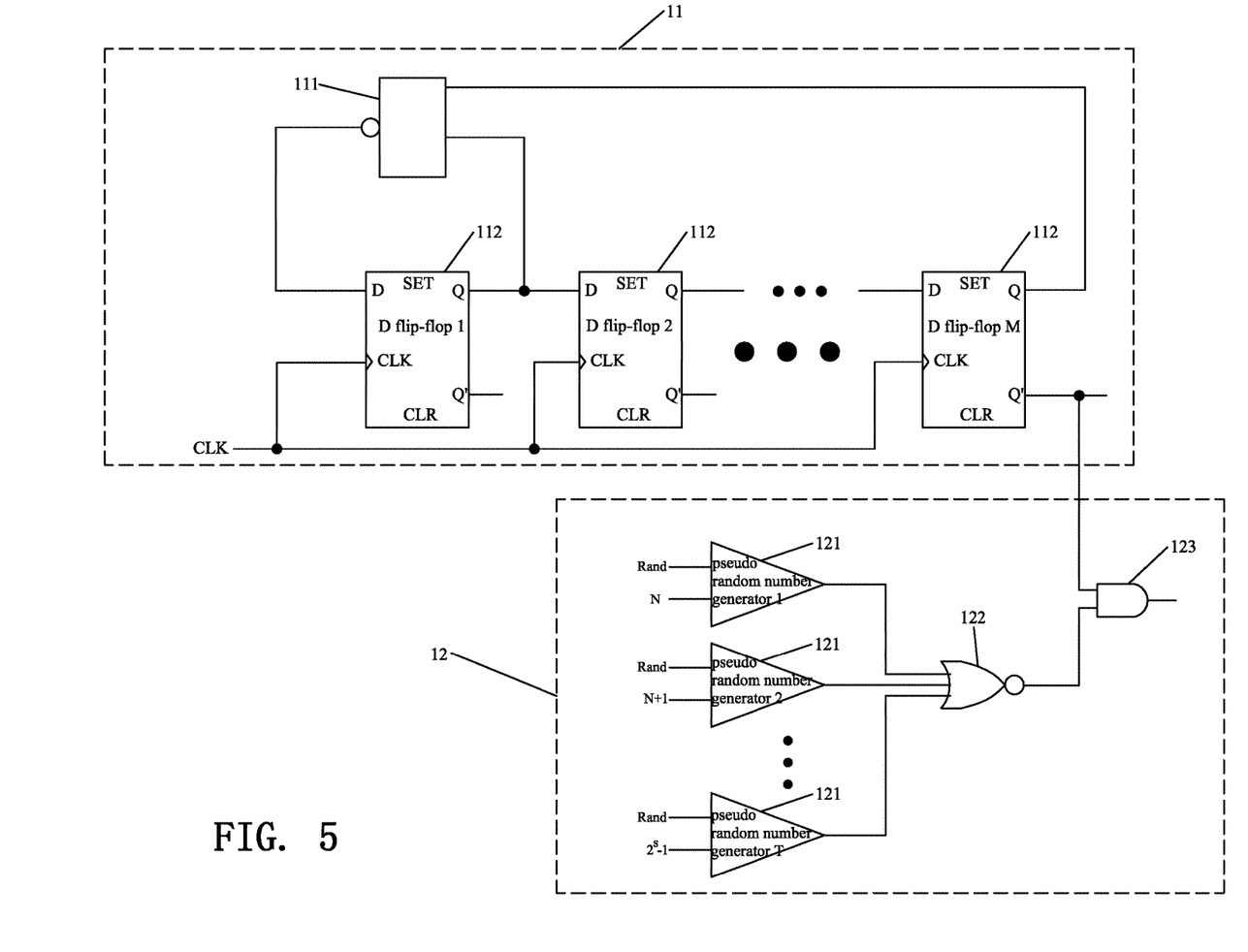
FIG. 5 is a circuit diagram of a pseudo random number generator in a second embodiment of the present invention.

Referring to FIG. 5, in the second embodiment of the present invention, the pseudo random number generator 1 includes a pseudo random number generating unit 11 and a pseudo random number correcting unit 12. Therein, the pseudo random number generating unit 11 is configured to generate an initial random number for every cycle of the scan clock. The initial random number is a binary integer, and the initial random number has a decimal numerical value set to be ranging $[0, 2^S-1]$, where S is a decimal integer, and S satisfies: $2^{S-1} \leq N \leq 2^S$. The pseudo random number correcting unit 12 is configured to control the pseudo random number generator 1 to generate the working random number according to the initial random number. Therein, when the initial random number is smaller than N, the pseudo random number correcting unit 12 controls the pseudo random number generator 1 to generate a working random number equal to the initial random number. When the initial random number is greater than or equal to N, the pseudo random number correcting unit 12 controls the pseudo random number generator 1 to generate a working random number equal to the initial random number minus the offset value, wherein the offset value is $2^{S-1}$. Therein, when the initial random number is greater than or equal to N, the working random number is equal to the initial random number minus the offset value. This ensures that the working random number generated by the pseudo random number generator 1 is always smaller than N.

Referring to FIG. 5, in the second embodiment of the present invention, the pseudo random number generating unit 11 includes an Exclusive-OR gate 111 and M D flip-flops 112, where M is a decimal integer, and M satisfies: M≥S. The CLK end of every D flip-flop 112 of the pseudo random number generating unit 11 receives the scan clock provided by the clock module 3. The Q end of the $i^{th}$ D flip-flop 112 is connected to the D end of the $(i+1)^{th}$ D flip-flop 112, where i is a decimal integer, and i has a decimal numerical value of [1, M−1]. The first input end of the Exclusive-OR gate 111 is connected to the Q end of the first D flip-flop 112. The second input end of the Exclusive-OR gate 111 is connected to the Q end of the $M^{th}$ D flip-flop 112. The output end of the Exclusive-OR gate 111 is connected to the D end of the first D flip-flop 112. The Q' end of the first D flip-flop 112 of the pseudo random number generating unit 11 through the Q' end of the $S^{th}$ D flip-flop 112 are configured to output the value of each order digit of the initial random number from the low-order digit to the high-order digit successively. The pseudo random number generating unit 11 of the second embodiment of the present invention generates the initial random number in the same way as the pseudo random number generating unit 11 of the first embodiment of the present invention does, and repetition is herein omitted.

Referring to FIG. 5, in the second embodiment of the present invention, the pseudo random number correcting unit 12 includes T random number comparators 121, an OR-NOT gate 122, and an AND gate 123. Therein, T is a decimal integer, and T satisfies: $T=2^S-N$. The random number comparator 121 is a numerical comparator. Different offset numbers are input to the random number comparators 121 at their first input ports. The offset numbers are binary integers, and the decimal numerical values of the offset numbers input to the first input ports of the random number comparators 121 are each set to be ranging [N, $2^S-1$]. Particularly, the offset numbers input to the first input ports of the random number comparators 121 are N through $2^S-1$, respectively. The second input port of every random number comparator 121 receives the initial random number output by the pseudo random number generating unit 11. When the initial random number the random number comparator 121 receives at its second input port is identical to the offset number input to its first input port, the output end of the random number comparator 121 outputs a high-level signal. The input ends of the OR-NOT gate 122 are connected to the respective output ends of the random number comparators 121. The output end of the OR-NOT gate 122 is connected to the first input end of the AND gate 123. The second input end of the AND gate 123 is connected to the Q' end of the $S^{th}$ D flip-flop of the pseudo random number generating unit 11. The Q' end of the first D flip-flop of the pseudo random number generating unit through the Q' end of the $(S-1)^{th}$ D flip-flop and the output end of the AND gate of the pseudo random number correcting unit are configured to output the value of each order digit of the working random number from the low-order digit to the high-order digit successively.

In the second embodiment of the present invention, the pseudo random number correcting unit 12 works on the principle as explained below.

When the initial random number is smaller than N, the output end of every random number comparator 121 of the pseudo random number correcting unit 12 outputs a low-level signal, which makes the OR-NOT gate output a high-level signal. At this time, the level at the output end of the AND gate depends on the level at the Q' end of the $S^{th}$ D flip-flop of the pseudo random number generating unit.

Since the Q' end of the first D flip-flop of the pseudo random number generating unit through the Q' end pf the $(S-1)^{th}$ D flip-flop and the output end of the AND gate of the pseudo random number correcting unit are configured to output the value of each order digit of the initial random number from the low-order digit to the high-order digit successively, the Q' end of the first D flip-flop 112 of the pseudo random number generating unit 11 through the Q' end of the $S^{th}$ D flip-flop 112 are configured to output the value of each order digit of the initial random number from the low-order digit to the high-order digit successively. In this way, when the initial random number is smaller than N, the pseudo random number correcting unit 12 controls the pseudo random number generator 1 to generate a working random number equal to the initial random number.

When the initial random number is greater than or equal to N, the offset number input to the first input port of a random number comparator 121 of the pseudo random number correcting unit 12 is equal to the initial random number, thereby making the output end of a random number comparator 121 of the pseudo random number correcting unit 12 output a high-level signal, which in turn makes the OR-NOT gate output a low-level signal. At this time, the level at the output end of the AND gate is low. Since the Q' end of the first D flip-flop of the pseudo random number generating unit through the Q' end of the $(S-1)^{th}$ D flip-flop and the output end of the AND gate of the pseudo random number correcting unit are configured to output the value of each order digit of the working random number from the low-order digit to the high-order digit successively, the Q' end of the first D flip-flop 112 of the pseudo random number generating unit 11 through the Q' end of the $S^{th}$ D flip-flop 112 are configured to output the value of each order digit of the initial random number from the low-order digit to the high-order digit successively. In this way, when the initial random number is greater than or equal to N, the pseudo random number correcting unit 12 controls the pseudo random number generator 1 to generate a working random number equal to the initial random number minus the offset value.

Figure 6:
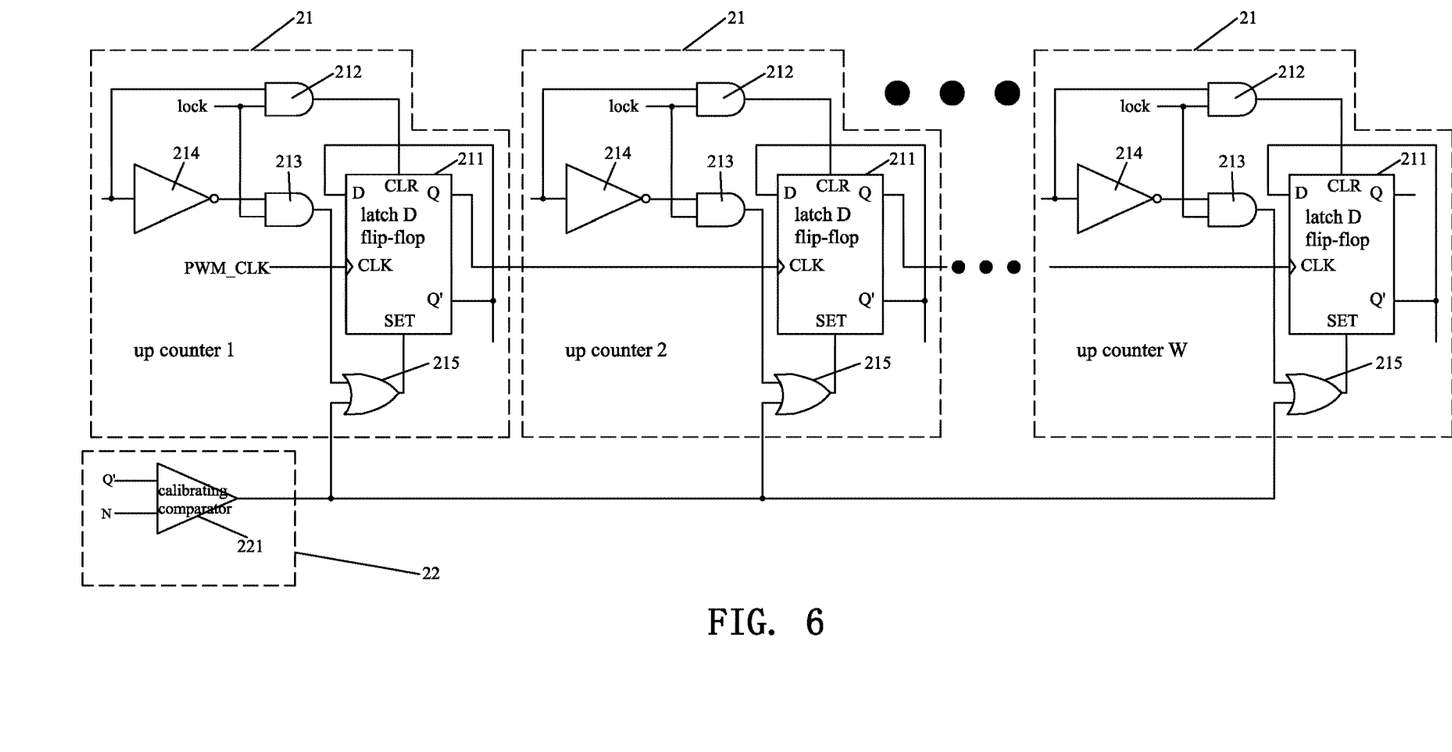
FIG. 6 is a circuit diagram of an up counter in the second embodiment of the present invention.

Referring to FIG. 6, in the second embodiment of the present invention, the up counter 2 includes W up-count units 21 and a calibrating unit 22. Therein, W is a decimal integer, and W satisfies: $2^{W-1} \le N \le 2^W$. The up-count unit 21 includes a latch D flip-flop 211, a first AND gate 212, a second AND gate 213, a NOT gate 214, and an OR gate 215. Therein, the first input end of the first AND gate 212 is connected to the input end of the NOT gate 214 and acts as the input end of the up-count unit 21. The output end of the NOT gate 214 is connected to the first input end of the second AND gate 213. The second input end of the first AND gate 212 and the second input end of the second AND gate 213 are connected to the same latch signal lock. The output end of the first AND gate 212 is connected to the CLR end of the latch D flip-flop 211. The output end of the second AND gate 213 is connected to the first input end of the OR gate 215. The output end of the OR gate 215 is connected to the SET end of the latch D flip-flop 211. The D end and the Q' end of the latch D flip-flop 211 are connected to each other and jointly act as the output end of the up-count unit 21. The CLK end of the latch D flip-flop 211 of the first up-count unit 21 of the up counter 2 receives the count clock PWM_CLK provided by the clock module 3. The Q end of the latch D flip-flop 211 of the $k^{th}$ up-count unit 21 is connected to the CLK end of the latch D flip-flop 211 of the $(k+1)^{th}$ up-count unit 21, where k is a decimal integer, and k has a decimal numerical value of [1, W−1]. The input end of the first up-count unit 21 of the up counter 2 through the input end of the $W^{th}$ up-count unit 21 are configured to receive the value of each order digit of the working random number from the low-order digit to the high-order digit successively. The output end of the first up-count unit 21 of the up counter 2 through the output end of the $W^{th}$ up-count unit 21 are configured to output the value of each order digit of the random power-on number from the low-order digit to the high-order digit successively. The calibrating unit 22 includes a calibrating comparator 221. The calibrating comparator 221 is a numerical comparator. The calibrating number is input to the calibrating comparator 221 at its first input port. The calibrating number is a binary integer, and the calibrating number has a decimal numerical value of N. The second input port of the calibrating comparator 221 receives the random power-on number. When the random power-on number the calibrating comparator 221 receives at its second input port is identical to the calibrating number input to its first input port, the output end of the calibrating comparator 221 outputs a high-level signal.

In the second embodiment of the present invention, the up counter 2 works on the principle as explained below.

According to the second embodiment of the present invention, when the random power-on number is smaller than the calibrating number, or to say, when the decimal numerical value of the random power-on number is smaller than N, the output end of the calibrating comparator 221 outputs a low level. The level at the output end of the OR gate 215 of every up-count unit 21 depends on the level at the output end of the second AND gate 213. In other words, the level at the SET end of the latch D flip-flop 211 of every up-count unit 21 depends on the level at the output end of the second AND gate 213 of the up-count unit 21. In this case, the up counter 2 of the second embodiment of the present invention generates the random power-on number in the same way as the up counter 2 of the first embodiment of the present invention does.

According to the second embodiment of the present invention, when the random power-on number is equal to the calibrating number, or to say, when the decimal numerical value of the random power-on number is equal to N, the output end of the calibrating comparator 221 outputs a high level. Consequently, the level at the output end of the OR gate 215 of every up-count unit 21 is high, so that the level at the SET end of the latch D flip-flop 211 of every up-count unit 21 is high. At this time, the latch D flip-flop 211 of every up-count unit 21 performs setting operation, thereby making the level at the output end of every up-count unit 21 become low. Consequently, the random power-on number is calibrated to zero.

The embodiments described as depicted are not intended to in any way limit forms and makes of possible implementations of the present invention, and people of ordinary skill in the art may perform modification and adaptation any of these without departing from the scope of the present invention.

What is claimed is:

1. A noise reduction circuit for a matrix LED driver, the noise reduction circuit comprising a pseudo random number generator, an up counter, a clock module, and N matrix switch controllers, where N is a decimal integer greater than or equal to two;

the clock module being configured to provide the pseudo random number generator with a scan clock and provide the up counter with a count clock, wherein the scan clock has a cycle length that is N times as great as a cycle length of the count clock;

the pseudo random number generator being configured to generate a working random number for the up counter during every cycle of the scan clock, wherein the working random number is a binary integer and has a decimal numerical value set to be ranging [0, N−1];

the up counter being configured to, between a start time and a storage time of the cycle of the scan clock, receive the working random number and output the working random number as a random power-on number, wherein a time length between the start time and the storage time of the cycle of the scan clock is smaller than the cycle length of the count clock; the up counter adding one to the random power-on number and outputting a resulting value every time the cycle length of the count clock elapses; and in the cycle of the scan clock, where a decimal numerical value of the random power-on number is equal to N, the up counter calibrating the random power-on number to zero and outputting the calibrated random power-on number, wherein the random power-on number is a binary integer and has the decimal numerical value set to be ranging [0, N−1]; and the matrix switch controllers each being a numerical comparator and having a first input port being input with a criterion numeral different from criterion numerals input to the other matrix switch controllers, the criterion numerals each being a binary integer and having a decimal numerical value set to be ranging [0, N−1]; and the matrix switch controllers each having a second input port configured to receive a said random power-on number output by the up counter, so that when the random power-on number received by the matrix switch controller at the second input port is identical to the criterion numeral input to the first input port, that matrix switch controller outputs a matrix switch power-on signal at an output end thereof.

2. The noise reduction circuit for a matrix LED driver of claim 1, wherein the pseudo random number generator includes a pseudo random number generating unit; the pseudo random number generating unit includes an Exclusive-OR gate and M D flip-flops, where M is a decimal integer, and M satisfies: $2^M \geq N$;

a CLK end of every D flip-flop receives the scan clock provided by the clock module, a Q end of the $i^{th}$ D flip-flop is connected to a D end of the $(i+1)^{th}$ D flip-flop, where i is a decimal integer, and i has a decimal numerical value of [1, M−1]; a first input end of the Exclusive-OR gate is connected to the Q end of the first D flip-flop, a second input end of the Exclusive-OR gate is connected to the Q end of the $M^{th}$ D flip-flop, an output end of the Exclusive-OR gate is connected to the D end of the first D flip-flop;

a Q' end of the first D flip-flop of the pseudo random number generating unit through a Q' end of the $P^{th}$ D flip-flop are configured to output the value of each order digit of the working random number from the low-order digit to the high-order digit successively, where P is a decimal integer, and P satisfies: $2^P = N$.

3. The noise reduction circuit for a matrix LED driver of claim 2, wherein the up counter includes R up-count units, where R is a decimal integer, and R satisfies: $2^R = N$;

the up-count unit includes a latch D flip-flop, a first AND gate, a second AND gate and a NOT gate, a first input end of the first AND gate is connected to an input end of the NOT gate and acts as an input end of the up-count unit, an output end of the NOT gate is connected to a first input end of the second AND gate, a second input end of the first AND gate and a second input end of the second AND gate receive a same latch signal, an output end of the first AND gate is connected to a CLR end of the latch D flip-flop, an output end of the second AND gate is connected to a SET end of the latch D flip-flop, a D end and a Q' end of the latch D flip-flop are connected to each other and jointly act as an output end of the up-count unit;

a CLK end of the latch D flip-flop of the first up-count unit of the up counter receives the count clock provided by the clock module; a Q end of the latch D flip-flop of the $j^{th}$ up-count unit is connected to the CLK end of the latch D flip-flop of the $(j+1)^{th}$ up-count unit, where j is a decimal integer, and j has a decimal numerical value of [1, R−1];

the input end of the first up-count unit of the up counter through the input end of the $R^{th}$ up-count unit are configured to receive the value of each order digit of the working random number from the low-order digit to the high-order digit successively, the output end of the first up-count unit of the up counter through the output end of the $R^{th}$ up-count unit are configured to output the value of each order digit of the random power-on number from the low-order digit to the high-order digit successively.

4. The noise reduction circuit for a matrix LED driver of claim 2, wherein the up counter includes W up-count units and a calibrating unit, where W is a decimal integer, and W satisfies: $2^{W-1} \leq N \leq 2^{W}$;

the up-count unit includes a latch D flip-flop, a first AND gate, a second AND gate, a NOT gate and an OR gate, a first input end of the first AND gate is connected to an input end of the NOT gate and acts as an input end of the up-count unit, an output end of the NOT gate is connected to a first input end of the second AND gate, a second input end of the first AND gate and a second input end of the second AND gate are connected to a same latch signal lock, an output end of the first AND gate is connected to a CLR end of the latch D flip-flop, an output end of the second AND gate is connected to a first input end of the OR gate, an output end of the OR gate is connected to a SET end of the latch D flip-flop, a D end and a Q' end of the latch D flip-flop are connected to each other and jointly act as an output end of the up-count unit, a CLK end of the latch D flip-flop of the first up-count unit of the up counter receives the count clock provided by the clock module, a Q end of the latch D flip-flop of the $k^{th}$ up-count unit is connected to the CLK end of the latch D flip-flop of the $(k+1)^{th}$ up-count unit, where k is a decimal integer, and k has a decimal numerical value of [1, W−1]; the input end of the first up-count unit of the up counter through the input end of the $W^{th}$ up-count unit are configured to receive the value of each order digit of the working random number from the low-order digit to the high-order digit successively, the output end of the first up-count unit of the up counter through the output end of the $W^{th}$ up-count unit are configured to output the value of each order digit of the random power-on number from the low-order digit to the high-order digit successively;

the calibrating unit includes a calibrating comparator, the calibrating comparator is a numerical comparator, a calibrating number is input to the calibrating comparator at the first input port, where the calibrating number is a binary integer, the calibrating number has a decimal numerical value of N, a second input port of the calibrating comparator receives the random power-on number; when the random power-on number the calibrating comparator receives at the second input port is identical to the calibrating number input to the first input port, an output end of the calibrating comparator outputs a high-level signal.

5. The noise reduction circuit for a matrix LED driver of claim 1, wherein the up counter includes R up-count units, where R is a decimal integer, and R satisfies: $2^{R}=N$;

the up-count unit includes a latch D flip-flop, a first AND gate, a second AND gate and a NOT gate, a first input end of the first AND gate is connected to an input end of the NOT gate and acts as an input end of the up-count unit, an output end of the NOT gate is connected to a first input end of the second AND gate, a second input end of the first AND gate and a second input end of the second AND gate receive a same latch signal, an output end of the first AND gate is connected to a CLR end of the latch D flip-flop, an output end of the second AND gate is connected to a SET end of the latch D flip-flop, a D end and a Q' end of the latch D flip-flop are connected to each other and jointly act as an output end of the up-count unit;

a CLK end of the latch D flip-flop of the first up-count unit of the up counter receives the count clock provided by the clock module; a Q end of the latch D flip-flop of the $j^{th}$ up-count unit is connected to the CLK end of the latch D flip-flop of the $(j+1)^{th}$ up-count unit, where j is a decimal integer, and j has a decimal numerical value of [1, R−1];

the input end of the first up-count unit of the up counter through the input end of the $R^{th}$ up-count unit are configured to receive the value of each order digit of the working random number from the low-order digit to the high-order digit successively, the output end of the first up-count unit of the up counter through the output end of the $R^{th}$ up-count unit are configured to output the value of each order digit of the random power-on number from the low-order digit to the high-order digit successively.

6. The noise reduction circuit for a matrix LED driver of claim 1, wherein the pseudo random number generator includes a pseudo random number generating unit and a pseudo random number correcting unit;

the pseudo random number generating unit is configured to generate an initial random number for every cycle of the scan clock, the initial random number is a binary integer, the initial random number has a decimal numerical value set to be ranging $[0, 2^{S}-1]$, where S is a decimal integer, and S satisfies: $2^{S-1} \leq N \leq 2^{S}$;

the pseudo random number correcting unit is configured to control the pseudo random number generator to generate the working random number according to the initial random number; when the initial random number is smaller than N, the pseudo random number correcting unit controls the pseudo random number generator to generate the working random number equal to the initial random number; when the initial random number is greater than or equal to N, the pseudo random number correcting unit controls the pseudo random number generator 1 to generate the working random number equal to the initial random number minus an offset value, wherein the offset value is $2^{S-1}$.

7. The noise reduction circuit for a matrix LED driver of claim 6, wherein the pseudo random number generating unit includes an Exclusive-OR gate and M D flip-flops, where M is a decimal integer, and M satisfies: M≥S; a CLK end of every D flip-flop of the pseudo random number generating unit receives the scan clock provided by the clock module, a Q end of the $i^{th}$ D flip-flop is connected to a D end of the $(i+1)^{th}$ D flip-flop, where i is a decimal integer, and i has a decimal numerical value of [1, M−1]; a first input end of the Exclusive-OR gate is connected to the Q end of the first D flip-flop, a second input end of the Exclusive-OR gate is connected to the Q end of the $M^{th}$ D flip-flop, an output end of the Exclusive-OR gate is connected to the D end of the first D flip-flop; a Q' end of the first D flip-flop of the pseudo random number generating unit through a Q' end of the $S^{th}$ D flip-flop are configured to output the value of each order digit of the initial random number from the low-order digit to the high-order digit successively.

8. The noise reduction circuit for a matrix LED driver of claim 7, wherein the pseudo random number correcting unit includes T random number comparators, an OR-NOT gate, and an AND gate; where T is a decimal integer, and T satisfies: $T=2^S-N$; each random number comparator is a numerical comparator, different offset numbers are input to the random number comparators at their first input port, where the offset numbers are binary integers, and the decimal numerical values of the offset numbers input to the first input ports of the random number comparators are each set to be ranging [N, $2^S-1$]; a second input port of every random number comparator receives the initial random number output by the pseudo random number generating unit; when the initial random number the random number comparator receives at the second input port is identical to the offset number input to the first input port, the output end of the random number comparator outputs a high-level signal; input ends of the OR-NOT gate are connected to the respective output ends of the random number comparators, an output end of the OR-NOT gate is connected to a first input end of the AND gate, a second input end of the AND gate is connected to the Q' end of the $S^{th}$ D flip-flop of the pseudo random number generating unit;

the Q' end of the first D flip-flop of the pseudo random number generating unit through the Q' end of the $(S-1)^{th}$ D flip-flop and an output end of the AND gate of the pseudo random number correcting unit are configured to output the value of each order digit of the working random number from the low-order digit to the high-order digit successively.

9. The noise reduction circuit for a matrix LED driver of claim 6, wherein the up counter includes W up-count units and a calibrating unit, where W is a decimal integer, and W satisfies: $2^{W-1} \leq N \leq 2^W$;

the up-count unit includes a latch D flip-flop, a first AND gate, a second AND gate, a NOT gate and an OR gate, a first input end of the first AND gate is connected to an input end of the NOT gate and acts as an input end of the up-count unit, an output end of the NOT gate is connected to a first input end of the second AND gate, a second input end of the first AND gate and a second input end of the second AND gate are connected to a same latch signal lock, an output end of the first AND gate is connected to a CLR end of the latch D flip-flop, an output end of the second AND gate is connected to a first input end of the OR gate, an output end of the OR gate is connected to a SET end of the latch D flip-flop, a D end and a Q' end of the latch D flip-flop are connected to each other and jointly act as an output end of the up-count unit, a CLK end of the latch D flip-flop of the first up-count unit of the up counter receives the count clock provided by the clock module, a Q end of the latch D flip-flop of the $k^{th}$ up-count unit is connected to the CLK end of the latch D flip-flop of the $(k+1)^{th}$ up-count unit, where k is a decimal integer, and k has a decimal numerical value of [1, W−1]; the input end of the first up-count unit of the up counter through the input end of the $W^{th}$ up-count unit are configured to receive the value of each order digit of the working random number from the low-order digit to the high-order digit successively, the output end of the first up-count unit of the up counter through the output end of the $W^{th}$ up-count unit are configured to output the value of each order digit of the random power-on number from the low-order digit to the high-order digit successively;

the calibrating unit includes a calibrating comparator, the calibrating comparator is a numerical comparator, a calibrating number is input to the calibrating comparator at the first input port, where the calibrating number is a binary integer, the calibrating number has a decimal numerical value of N, a second input port of the calibrating comparator receives the random power-on number; when the random power-on number the calibrating comparator receives at the second input port is identical to the calibrating number input to the first input port, an output end of the calibrating comparator outputs a high-level signal.

10. The noise reduction circuit for a matrix LED driver of claim 1, wherein the up counter includes W up-count units and a calibrating unit, where W is a decimal integer, and W satisfies: $2^{W-1} \leq N \leq 2^W$;

the up-count unit includes a latch D flip-flop, a first AND gate, a second AND gate, a NOT gate and an OR gate, a first input end of the first AND gate is connected to an input end of the NOT gate and acts as an input end of the up-count unit, an output end of the NOT gate is connected to a first input end of the second AND gate, a second input end of the first AND gate and a second input end of the second AND gate are connected to a same latch signal lock, an output end of the first AND gate is connected to a CLR end of the latch D flip-flop, an output end of the second AND gate is connected to a first input end of the OR gate, an output end of the OR gate is connected to a SET end of the latch D flip-flop, a D end and a Q' end of the latch D flip-flop are connected to each other and jointly act as an output end of the up-count unit, a CLK end of the latch D flip-flop of the first up-count unit of the up counter receives the count clock provided by the clock module, a Q end of the latch D flip-flop of the $k^{th}$ up-count unit is connected to the CLK end of the latch D flip-flop of the $(k+1)^{th}$ up-count unit, where k is a decimal integer, and k has a decimal numerical value of [1, W−1]; the input end of the first up-count unit of the up counter through the input end of the $W^{th}$ up-count unit are configured to receive the value of each order digit of the working random number from the low-order digit to the high-order digit successively, the output end of the first up-count unit of the up counter through the output end of the $W^{th}$ up-count unit are configured to output the value of each order digit of the random power-on number from the low-order digit to the high-order digit successively;

the calibrating unit includes a calibrating comparator, the calibrating comparator is a numerical comparator, a calibrating number is input to the calibrating comparator at the first input port, where the calibrating number is a binary integer, the calibrating number has a decimal numerical value of N, a second input port of the calibrating comparator receives the random power-on number; when the random power-on number the calibrating comparator receives at the second input port is identical to the calibrating number input to the first input port, an output end of the calibrating comparator outputs a high-level signal.

\* \* \* \* \*